US010696511B2

United States Patent
Kobayashi et al.

(10) Patent No.: US 10,696,511 B2
(45) Date of Patent: Jun. 30, 2020

(54) TAPE REEL SUPPORTING DEVICE, COMPONENT PLACEMENT MACHINE, AND TAPE REEL SUPPORTING METHOD

(71) Applicant: Panasonic Intellectual Property Management Co., Ltd., Osaka (JP)

(72) Inventors: Hiroki Kobayashi, Fukuoka (JP); Yoshiaki Awata, Osaka (JP); Tetsushi Oohori, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 330 days.

(21) Appl. No.: 15/833,341

(22) Filed: Dec. 6, 2017

(65) Prior Publication Data
US 2018/0179017 A1  Jun. 28, 2018

(30) Foreign Application Priority Data
Dec. 28, 2016 (JP) .................... 2016-254957

(51) Int. Cl.
*B65H 49/32* (2006.01)
*B65H 49/24* (2006.01)
*H05K 13/04* (2006.01)

(52) U.S. Cl.
CPC ........... *B65H 49/325* (2013.01); *B65H 49/24* (2013.01); *H05K 13/0417* (2013.01); *B65H 2701/37* (2013.01)

(58) Field of Classification Search
CPC .. B65H 49/325; B65H 49/24; B65H 2701/37; H05K 13/0417; H05K 13/02
See application file for complete search history.

(56) References Cited

U.S. PATENT DOCUMENTS

| | | | | |
|---|---|---|---|---|
| 2,679,987 A | * | 6/1954 | Saliba | B65H 61/00 242/393 |
| 2,721,710 A | * | 10/1955 | Birchler | B65H 49/24 242/559.4 |
| 3,375,991 A | * | 4/1968 | Conforti | B65H 54/42 242/470 |
| 3,743,205 A | * | 7/1973 | Misrach | B21C 47/18 242/595.1 |

(Continued)

FOREIGN PATENT DOCUMENTS

| | | |
|---|---|---|
| JP | S54-161331 A | 12/1979 |
| JP | H06-183614 A | 7/1994 |

(Continued)

*Primary Examiner* — William A. Rivera
(74) *Attorney, Agent, or Firm* — Pearne & Gordon LLP (57) ABSTRACT

A tape reel supporting device includes a plurality of shaft members and a plurality of roller members. The plurality of shaft members extend to be parallel to each other in a horizontal direction. The plurality of roller members are provided to be externally fitted into each of the plurality of shaft members, and each of two inclined surfaces inclined to an axis of each shaft member abuts on an outer peripheral edge of each of a pair of disk members. The two inclined surfaces provided on each of the plurality of roller members are inclined in directions opposite to each other in a direction along an axis of each shaft member on which the roller member is provided.

6 Claims, 8 Drawing Sheets

(56) References Cited

U.S. PATENT DOCUMENTS

| | | | | | |
|---|---|---|---|---|---|
| 4,632,326 | A | * | 12/1986 | Boote | ............... B21C 47/16 |
| | | | | | 242/410 |
| 4,804,152 | A | * | 2/1989 | Masuda | ............. B65H 18/10 |
| | | | | | 242/540 |
| 6,438,819 | B1 | * | 8/2002 | McGlinchy | .......... B21C 37/155 |
| | | | | | 29/414 |
| 6,502,783 | B1 | * | 1/2003 | Smith | ............... B65H 18/106 |
| | | | | | 242/393 |
| 7,610,681 | B2 | * | 11/2009 | Calcei | ............... B21D 53/74 |
| | | | | | 242/422.4 |
| 2006/0075719 | A1 | * | 4/2006 | James | .............. E06B 3/67308 |
| | | | | | 52/750 |

FOREIGN PATENT DOCUMENTS

| | | |
|---|---|---|
| JP | 2013-048129 A | 3/2013 |
| WO | 2016/170611 A1 | 10/2016 |

* cited by examiner

TAPE REEL SUPPORTING DEVICE, COMPONENT PLACEMENT MACHINE, AND TAPE REEL SUPPORTING METHOD

BACKGROUND

1. Technical Field

The disclosure relates to a tape reel supporting device, a component placement machine, and a tape reel supporting method, in which a tape reel configured to interpose a core member, around which a tape is wound, between a pair of disk member is supported in such a manner that a center axis of the core member is horizontal.

2. Description of the Related Art

In the related art, a technology is known, in which a carrier tape storing a component is wound around a tape reel to be supplied, the carrier tape is pulled out from the tape reel to be pitch-fed by a tape feeder, and thus, the component is supplied to a component placement machine. The tape reel is configured such that a core member, around which the carrier tape is wound, is interposed between a pair of disk members. When the tape reel is used in the component placement machine, the tape reel is supported in a perpendicular state (a state in which a center axis of the core member is horizontal) and in a state where the tape reel is rotatable around the center axis of the core member.

As a tape reel supporting device supporting the tape reel in this way, a rack type device in which a tape reel is inserted between two partition members, a roller support type device in which a plurality of locations of an outer peripheral edge of a disk member are supported by a plurality of roller member each fitted externally into a plurality of shaft member extending to be parallel to each other in a horizontal direction (for example, refer to PTL 1: WO 2016/170611).

SUMMARY

A tape reel supporting device of the disclosure supports a tape reel configured to interpose a core member, around which a carrier tape having a stored component is wound, between a pair of disk members, in such a manner that a center axis of the core member is horizontal.

The tape reel supporting device includes a plurality of shaft members and a plurality of roller members.

The plurality of shaft members extend to be parallel to each other in a horizontal direction.

The plurality of roller members are provided to be externally fitted into each of the plurality of shaft members, and each of two inclined surfaces inclined to an axis of each shaft member abuts on an outer peripheral edge of each of a pair of disk members.

The two inclined surfaces of each of the plurality of roller members are inclined in directions opposite to each other in a direction along the axis of each shaft member on which the roller members are provided.

A component placement machine of the disclosure includes a component supplier and a component mounter.

The component supplier which pulls out the carrier tape from the tape reel supported by the tape reel supporting device and supplies the component to a pick-up position.

The component mounter picks-up the component supplied to the pick-up position by the component supplier and installs the component on a board.

According to a tape reel supporting method, a tape reel configured to interpose a core member, around which a carrier tape having a stored component is wound, between a pair of disk members, is supported in such a manner that a center axis of the core member is horizontal, using a tape reel supporting device including a plurality of shaft members which extend to be parallel to each other in a horizontal direction and a plurality of roller members which are provided to be externally fitted into each of the plurality of shaft members.

The tape reel supporting method includes configuring each of the plurality of roller members such that two inclined surfaces inclined to an axis of the shaft member on which the roller member is provided are inclined in directions opposite to each other in a direction along the axis of the shaft member; and allowing each of the two inclined surfaces provided on each of the plurality of roller members to abut on an outer peripheral edge of each of the pair of disk members.

DETAILED DESCRIPTION

In the related art, a rack type tape reel supporting device, in order to accommodate a tape reel regardless of a reel width (a distance between two disk members), a distance between two partition members is required to be set according to a maximum dimension of the reel width. Accordingly, in most cases, the tape reel is inclined from a perpendicular state between two partition members. The roller support type tape reel supporting device disclosed in PTL 1, the outer peripheral edge of one disk member is disposed between the adjacent two roller members provided on the same shaft member, and the tape reel is inclined from the perpendicular state. If the tape reel is inclined from the perpendicular state, the carrier tape is pulled out and a rotation state of the carrier tape is unstable when being rotated, and thus, there are concerns that a smooth supply of the carrier tape is hindered or the disk member is bent and damaged.

Figure 1:
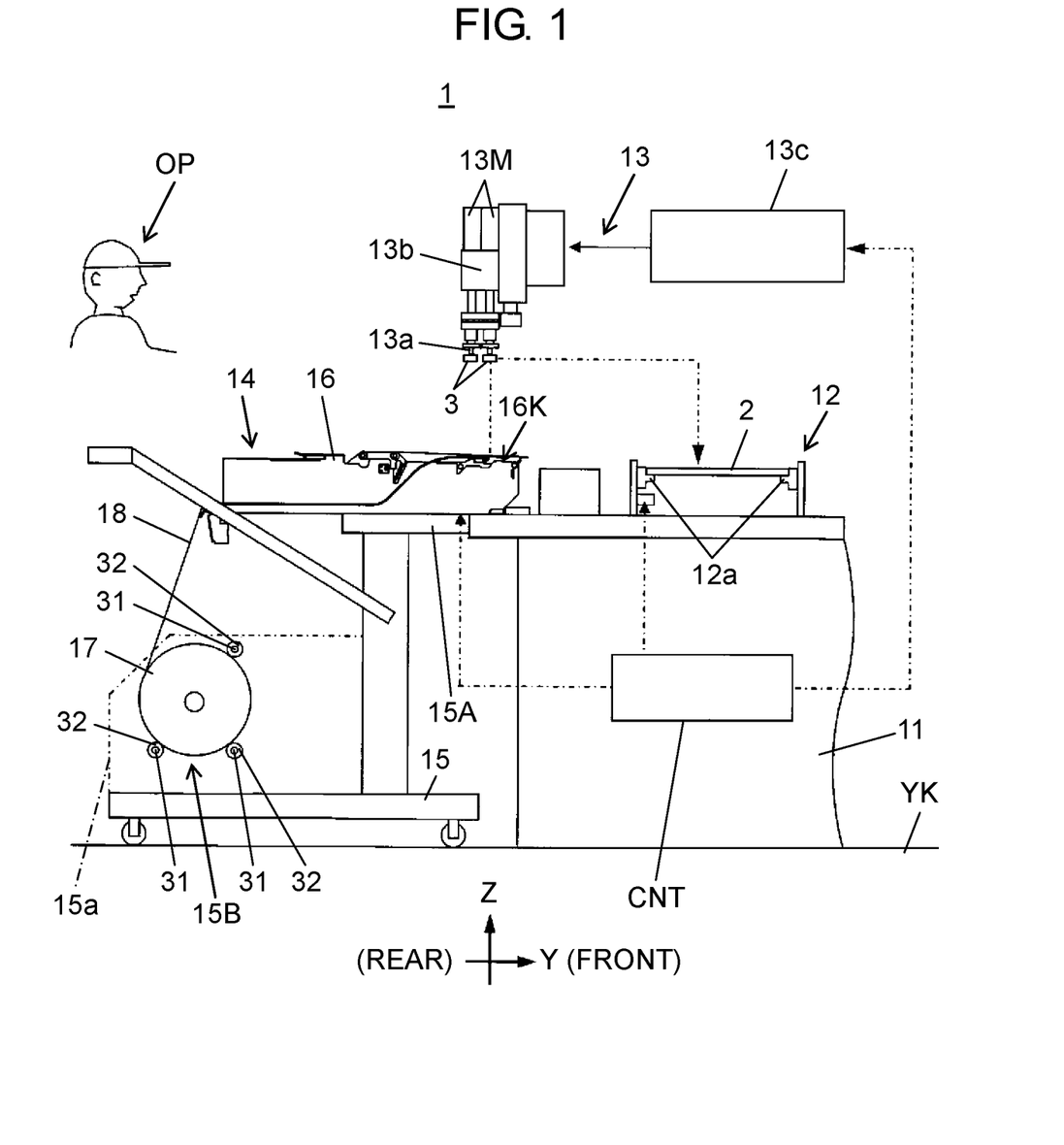
FIG. 1 is a side view of a component placement machine in an embodiment.

Hereinafter, embodiments of the disclosure will be described with reference to the drawings. Component placement machine 1 shown in FIG. 1 is an apparatus which installs component 3 on board 2 and includes base 11, board transporter 12, component mounter 13, and component supplier 14. Here, for convenience of explanation, when worker OP views component placement machine 1, a right-left direction of component placement machine 1 is referred to as an X axis direction, and an up-down direction of component placement machine 1 is referred to as a Z axis direction. When worker OP views component placement machine 1, a forward-rearward direction of component placement machine 1 is referred to as a Y axis direction, a rear side from worker OP is referred to a front side, and a front side of worker OP is referred to as a rear side.

In FIG. 1, board transporter 12 includes pair of conveyor 12a extending on base 11 in the X axis direction. Board transporter 12 supports both end portions of board 2 in the Y axis direction by pair of conveyor 12a from below and transports board 2 in the X axis direction. Component mounter 13 includes install head 13b having suction nozzle 13a and head movement mechanism 13c which moves install head 13b in a horizontal plane direction. Install head 13b moves suction nozzle 13a in the Z axis direction and includes nozzle drive mechanism 13M which rotates suction nozzle 13a around the Z axis.

Figure 2:
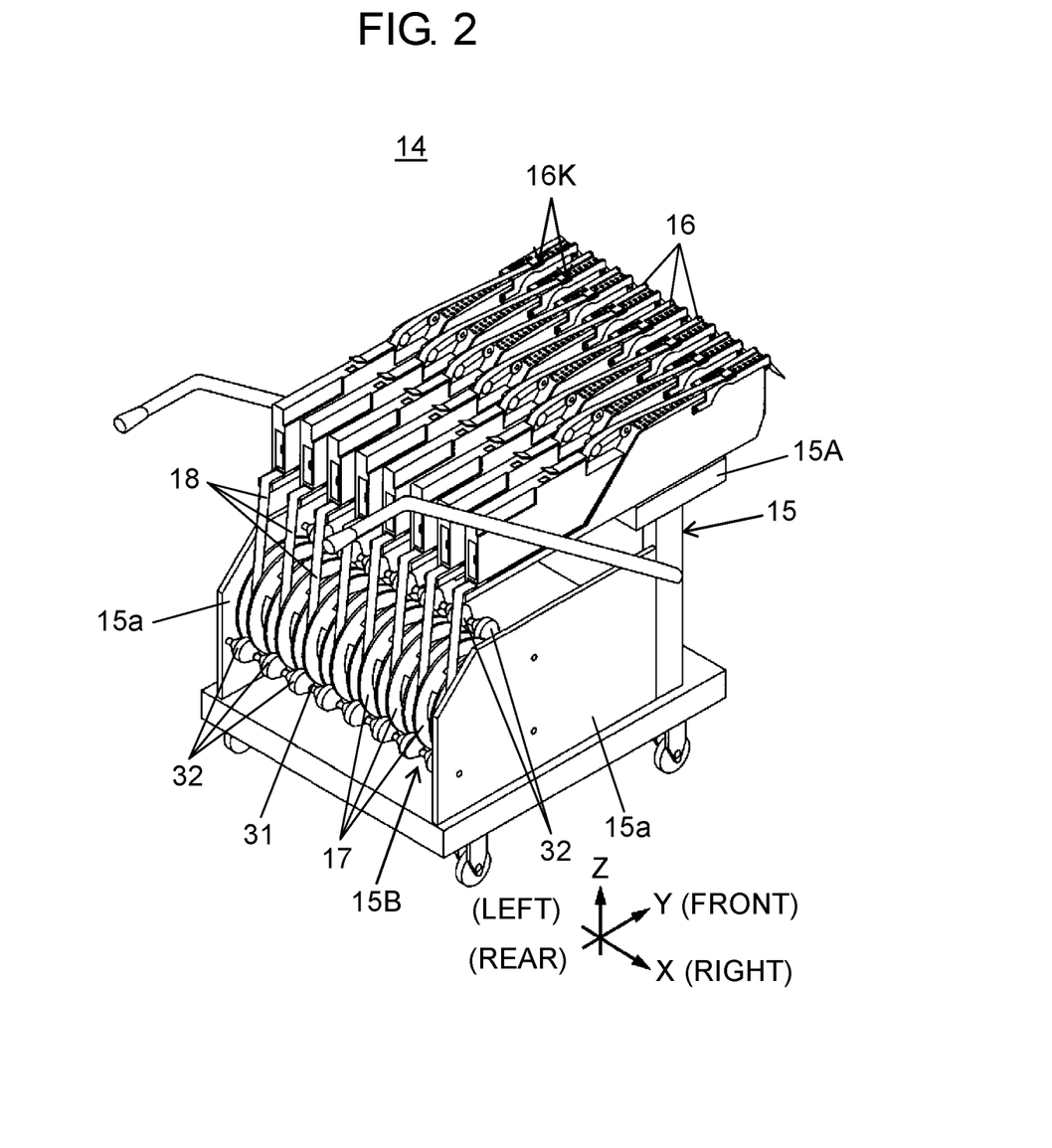
FIG. 2 is a perspective view showing a feeder carriage provided in the component placement machine of the embodiment together with a tape reel.

In FIG. 2, component supplier 14 includes feeder carriage 15, plurality of (here, for example, eight) taper feeders 16, and plurality of tape reels 17 corresponding to the number of tape feeder 16. Feeder carriage 15 is operated by worker OP and moves freely on floor surface YK, and includes feeder installer 15A and tape reel supporting device 15B. Each of tape feeders 16 is detachably attached to feeder installer 15A, worker OP moves feeder carriage 15 on floor surface YK to connect feeder installer 15A to base 11, and thus, plurality of tape feeders 16 can be simultaneously attached to base 11.

Figure 3:
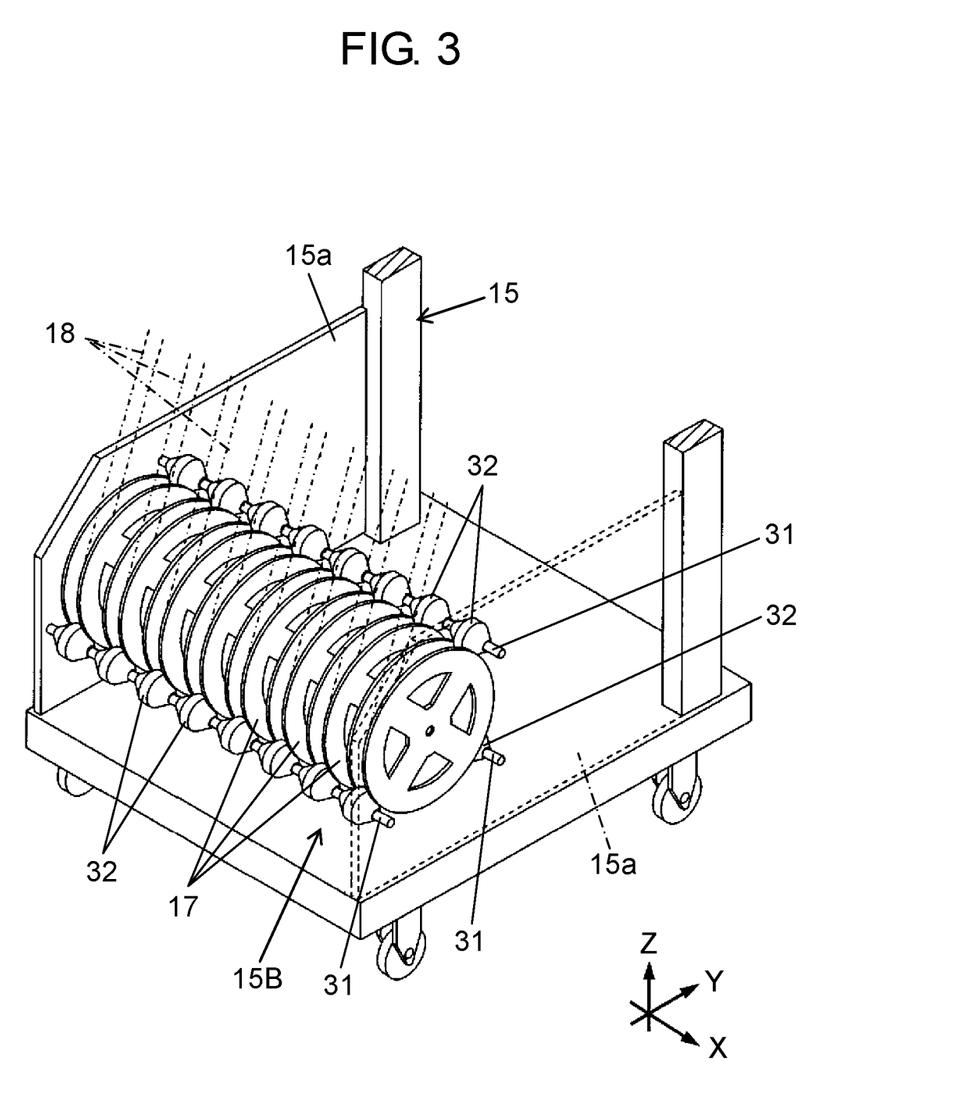
FIG. 3 is a perspective view showing a portion of a tape reel supporting device of the feeder carriage provided in the component placement machine of the embodiment together with the tape reel.

In FIGS. 1, 2, and 3, tape reel supporting device 15B is positioned between right and left side plates 15a provided in feeder carriage 15. Each of tape reels 17 has a configuration in which cylindrical core member 21 is interposed between pair of disk members 22 (FIG. 4) and carrier tape 18 (tape) is wound around core member 21. Plurality of components 3 are individually stored in carrier tape 18.

In FIGS. 1 and 2, each of tape reels 17 is supported by tape reel supporting device 15B to be positioned immediately below corresponding tape feeder 16. Carrier tape 18 is pulled out from each of tape reels 17 and pulled-out carrier tape 18 is introduced into a rear end portion of corresponding tape feeder 16. Each of tape feeders 16 pitch-feeds carrier tape 18, and thus, components 3 stored in carrier tape 18 are intermittently supplied to pick-up position 16k of each component 3 by suction nozzle 13a.

In FIG. 1, controller CNT provided in component placement machine 1 performs a control of a transport operation of board 2 by board transporter 12 and a control of a supply operation of component 3 by tape feeder 16. Controller CNT also performs a control of a movement operation of install head 13b by head movement mechanism 13c, controls of lifting, lowering, and rotating operations of suction nozzle 13a by nozzle drive mechanism 13M, or the like.

In FIGS. 2 and 3, tape reel supporting device 15B is configured to include plurality of (here, three) shaft members 31 extending to be parallel to each other in a horizontal direction (X axis direction) and plurality of roller members 32 which are provided to be each inserted externally into plurality of shaft members 31. Both end portions of shaft member 31 are supported by right and left side plates 15a provided in feeder carriage 15. Plurality of (here, eight) roller members 32 corresponding to the number of tape feeders 16 installable to feed installer 15A are provided on shaft member 31. In each of roller members 32, a movement of roller members 32 in an extension direction (X axis direction) of axis 31J of shaft member 31 extends with respect to shaft member 31 on which roller member 32 is provided is restrained by a movement restraint (not shown).

Figure 4:
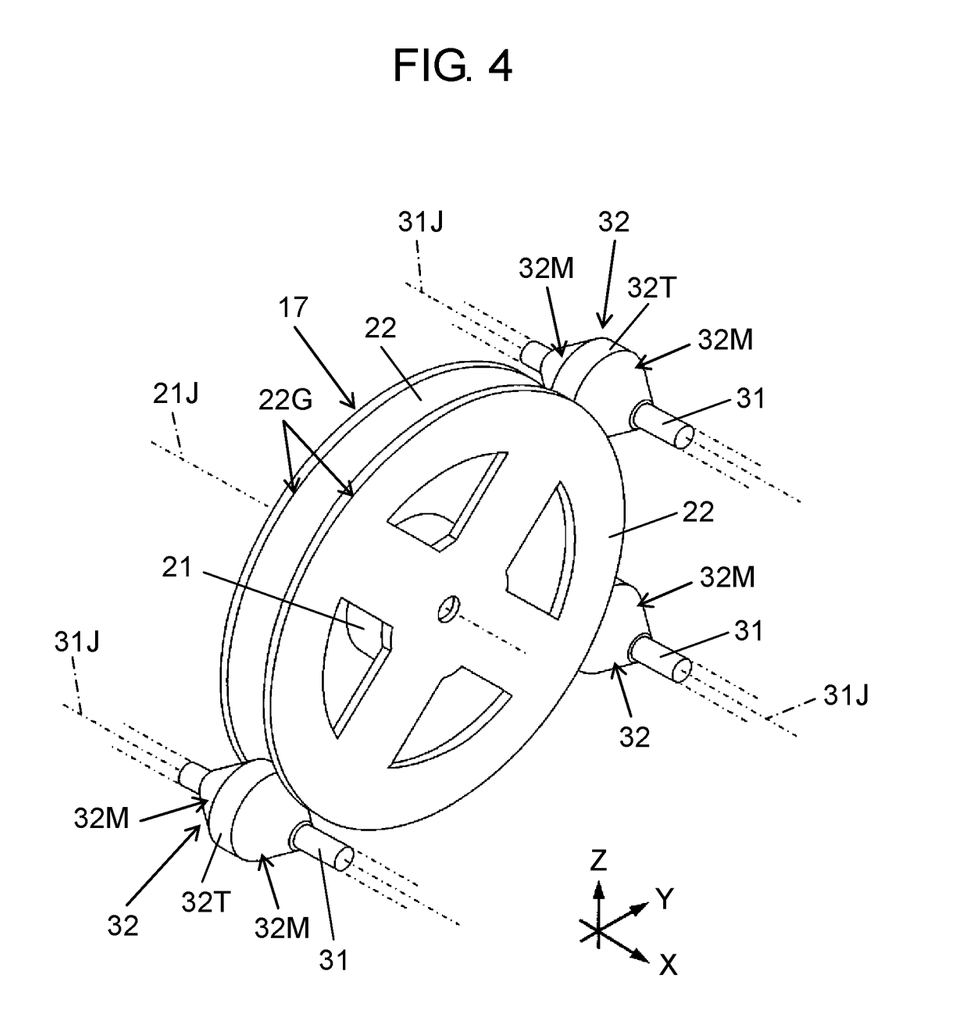
FIG. 4 is a perspective view showing a portion of the tape reel supporting device in the embodiment together with the tape reel.
Figure 5:
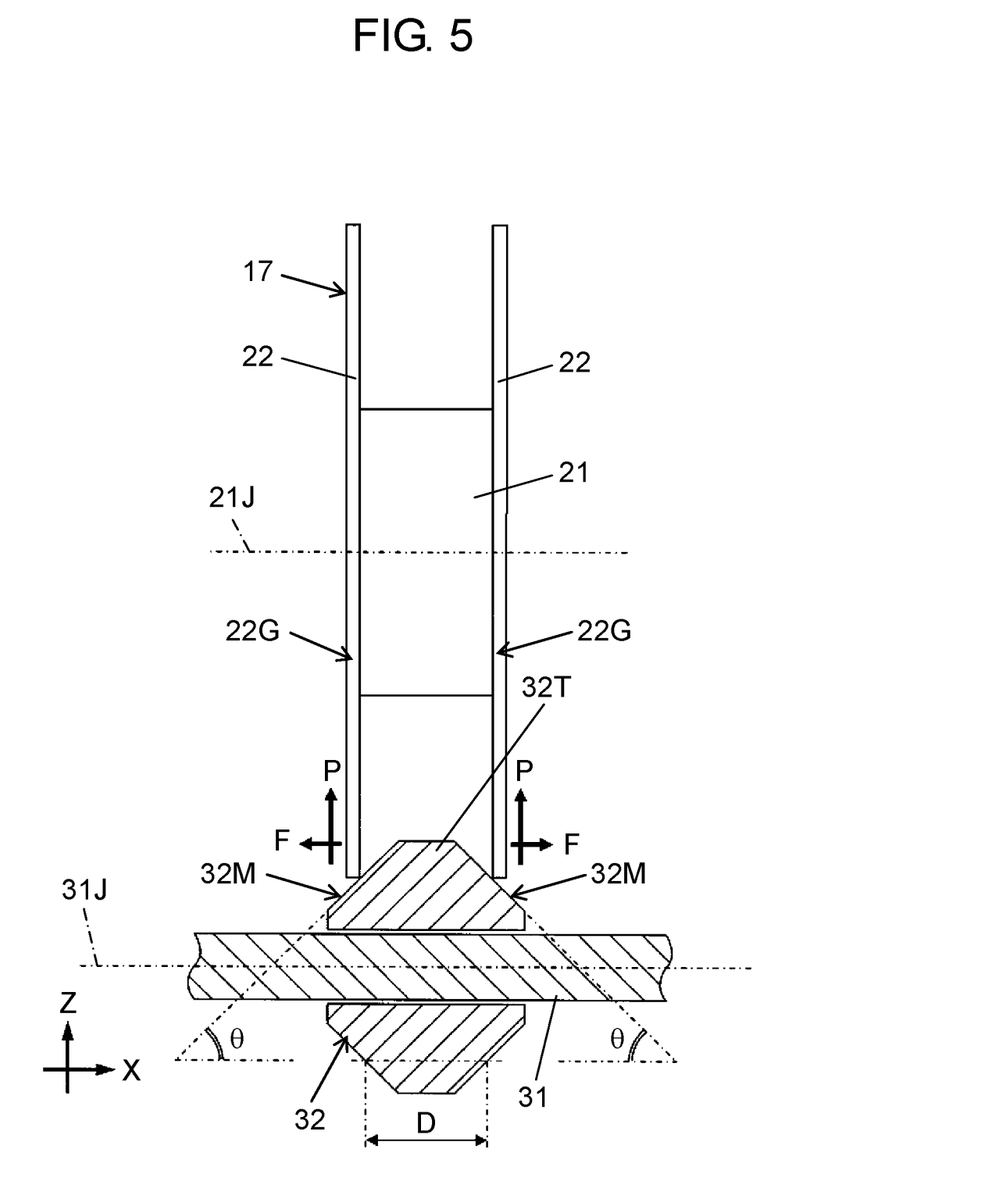
FIG. 5 is a partially sectional view showing a portion of the tape reel supporting device in the embodiment together with the tape reel.

As shown in FIGS. 4 and 5, two inclined surfaces 32M inclined to axis 31J (here, parallel to the X axis) of shaft member 31 on which roller member 32 is provided are formed on each of plurality of roller members 32. Inclination angles θ of two inclined surfaces 32M with respect to axis 31J of shaft member 31 on which roller member 32 is provided are the same as each other (substantially the same as each other), and two inclined surfaces 32M are surfaces which are inclined in directions opposite to each other in the direction along axis 31J of shaft member 31 and abutment surfaces which abut on outer peripheral edges 22G of pair of disk members 22.

In the present embodiment, each of two inclined surfaces 32M provided on roller member 32 is configured to be a conical surface having axis 31J of shaft member 31 as a peripheral line. In the present embodiment, as shown in FIGS. 4 and 5, two inclined surfaces 32M of roller member 32 are formed such that distance D between two inclined surfaces 32M in the direction along axis 31J of shaft member 31 gradually decreases radially outward from axis 31J of shaft member 31. In other words, two inclined surfaces 32M are formed such that a distance between axis 31J and each of inclined surfaces 32M decreases in a direction from core member 21 toward disk member 22. Accordingly, two inclined surfaces 32M are inclined in the directions opposite to each other in the direction along axis 31J of shaft member 31. Accordingly, each of shown roller members 32 includes projection portion 32T protruding radially outward from axis 31J of shaft member 31, and two inclined surfaces 32M inclined in the directions opposite to each other are disposed on right and left (X axis direction) side portions of projection portion 32T.

As shown in FIG. 5, in the present embodiment, outer peripheral edges 22G of pair of disk members 22 of tape reel 17 are supported by three roller members 32 each provided on three shaft members 31. In this state, pair of disk members 22 receive pressing forces P applied from two inclined surfaces 32M toward center axis 21J of core member 21 of taper reel 17 and receive forces F in opposite directions in the direction (X axis direction) along axis 31J of shaft member 31. Accordingly, tape reel 17 is stably supported in a perpendicular state (state in which center axis 21J of core member 21 is horizontal) in a condition where a movement (lateral shaking) of tape reel 17 in the extension direction (X axis direction) of center axis 21J of core member 21 is suppressed. Two inclined surfaces 32M are inclined in the directions opposite to each other in the direction along axis 31J of shaft member 31, and thus, plurality of kinds of tape reels 17 having different reel widths can be supported. In two inclined surfaces 32M of each of plurality of roller members 32, the inclination angles with respect to axis 31J of shaft member 31 on which roller member 32 is provided are the same (substantially the same) as each other, and thus, it is possible to support tape reel 17 with extremely high stability.

When worker OP sets tape reels 17 to tape reel supporting device 15B, worker OP arranges tape reels 17 in a condition where tape reels 17 are in the perpendicular states and supports pair of disk members 22 by three roller members 32. In this case, each of projection portions 32T of three roller members 32 is inserted between pair of disk members 22. Accordingly, each of two inclined surfaces 32M of each roller member 32 abuts on each of outer peripheral edges 22G of pair of disk members 22 of tape reel 17. As a result, each tape reel 17 is supported in a condition of being in the perpendicular state by three roller members 32 and being rotatable around center axis 21J of core member 21.

In this way, in a method of supporting tape reel 17 using tape reel supporting device 15B, two inclined surfaces 32M abut on outer peripheral edges 22G of pair of disk members 22, in which two inclined surfaces 32M are formed on each of plurality of roller members 32 to be inclined in the directions opposite to each other in the direction (X axis direction) along axis 31J of shaft member 31 on which roller member 32 is provided and are provided on each of plurality of roller members 32.

When component placement machine 1 performs a component installation operation of installing components 3 on board 2, first, controller CNT operates board transporter 12 to carry-in board 2 fed from an upstream process and positions board 2 at a work position. Controller CNT operates tape feeder 16 to supply components 3 to pick-up position 16K and operates head movement mechanism 13c to reciprocate install head 13b between tape feeders 16 and board 2. During this time, tape feeder 16 operates nozzle drive mechanism 13M such that suction nozzle 13a picks-up component 3 positioned at pick-up position 16K and installs component 3 picked-up by suction nozzle 13a on board 2. If all components 3 to be installed on board 2 by install head 13b are installed on board 2, controller CNT operates board transporter 12 to convey-out board 2 to a downstream process.

In the process of the component installation operation, when tape feeders 16 supply components 3, carrier tapes 18 are pulled out from tape reels 17. In this case, each tape reel 17 is supported in a perpendicular state and is rotatable about center axis 21J of core member 21 by three roller members 32, and thus, tape reel 17 rotates without being laterally shaken in a perpendicular plane when carrier tape 18 is pulled out, the rotation state of tape reel 17 is stable, and disk members 22 are not bent.

As described above, in tape reel supporting device 15B (component placement machine 1 and the tape reel supporting method) of the present embodiment, each roller member 32 is provided to be externally fitted into each of plurality of shaft members 31 extending to be parallel to each other in the horizontal direction. In each roller member 32, each of two inclined surfaces 32M inclined to axis 31J of shaft member 31 on which roller member 32 is provided abut on each of outer peripheral edges 22G of pair of disk members 22. Here, two inclined surfaces 32M of each roller member 32 are inclined in the directions opposite to each other in the direction along axis 31J of shaft member 31 on which roller member 32 is provided. Accordingly, each tape reel 17 is stably supported in the perpendicular state regardless of the reel width in a state where the lateral shaking is suppressed. In the present embodiment, in two inclined surfaces 32M provided on each of plurality of roller members 32, the inclination angles with respect to axis 31J of shaft member 31 on which roller member 32 is provided are the same (substantially the same) as each other, stability of tape reel 17 during the support becomes extremely high.

Therefore, if tape reels 17 are stably supported in the perpendicular states, when positions of tape reels 17 in tape reel supporting device 15B are detected by a detector or the like, reliability increases. Accordingly, for example, when a tape reel replacement device or the like in which tape reels 17 enter and are taken out automatically from tape reel supporting device 15B is introduced, it is possible to perform processing with extremely high accuracy.

Figure 6:
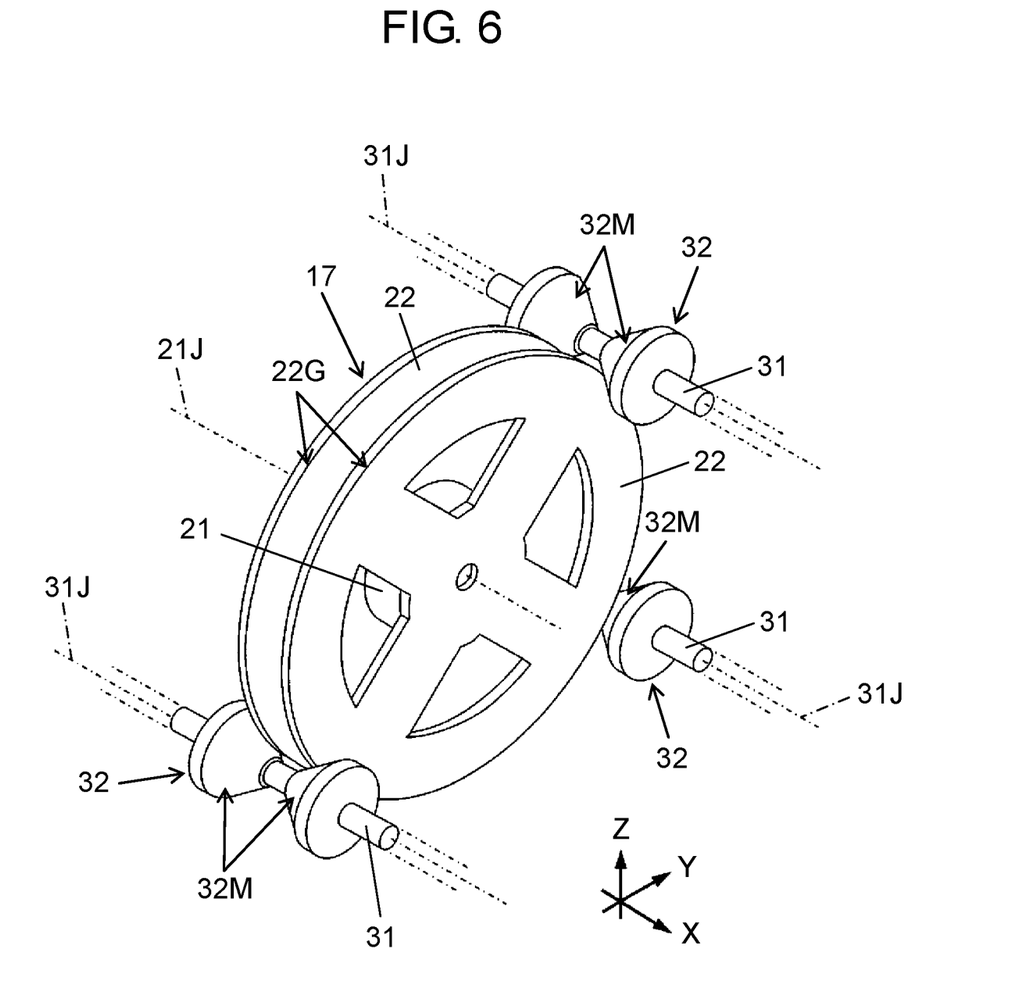
FIG. 6 is a perspective view showing a portion of a tape reel supporting device in a modification example of the embodiment together with the tape reel.
Figure 7:
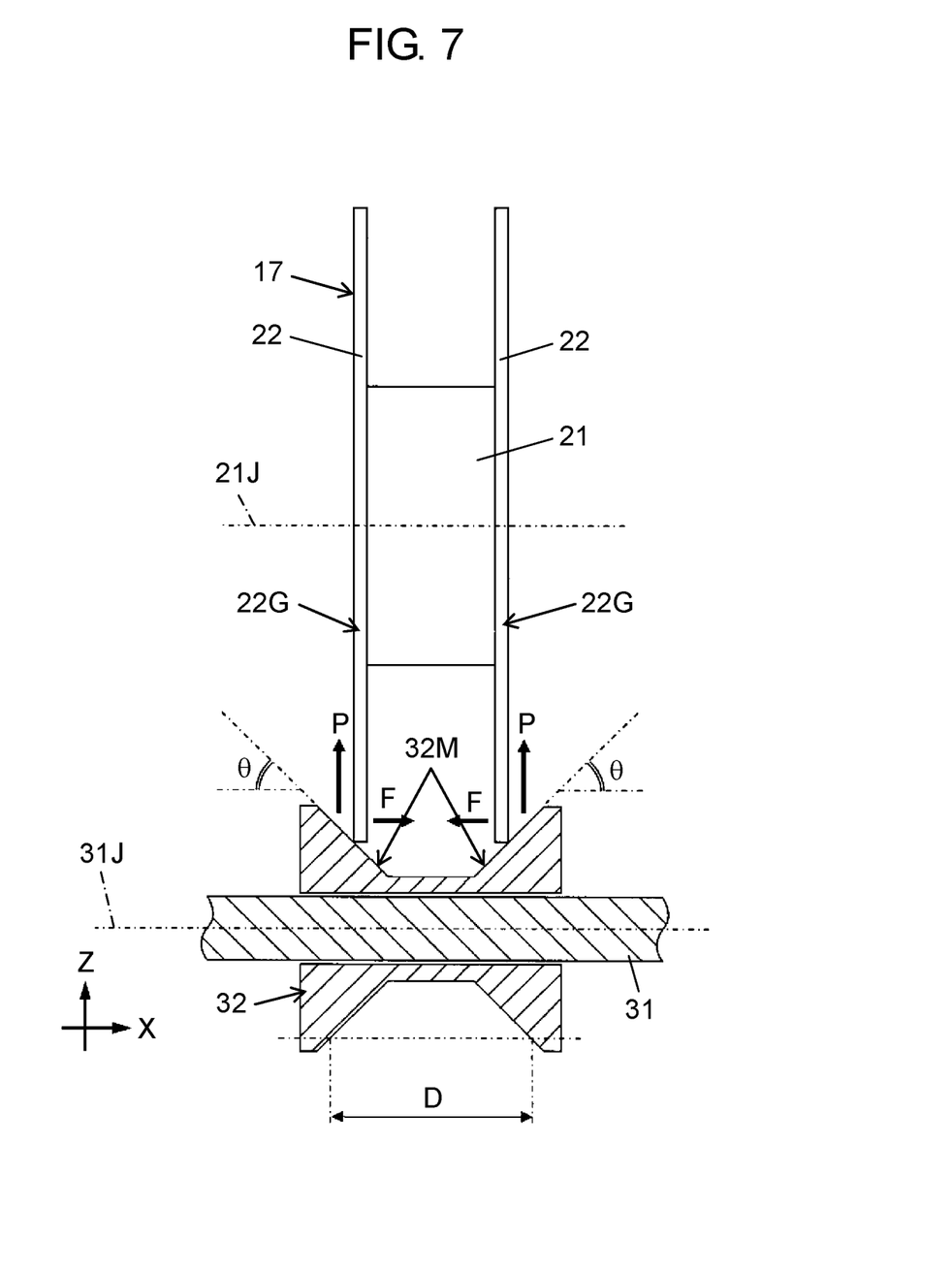
FIG. 7 is a partially sectional view showing a portion of the tape reel supporting device in the modification example of the embodiment together with the tape reel.

Hereinbefore, the present embodiment is described. However, the disclosure is not limited to the above-described embodiment. For example, the shapes of two inclined surfaces 32M provided on each roller member 32 provided to be externally fitted into shaft member 31 are not limited to those shown in the above-described embodiment as long as two inclined surfaces 32M are inclined in the directions opposite to each other in the direction along axis 31J of shaft member 31 on which each roller member 32 is provided. Accordingly, for example, each roller member 32 may have a shape shown in a modification example of FIGS. 6 and 7. In each roller member 32 shown in this modification example, two inclined surfaces 32M are formed such that distance D (FIG. 7) between two inclined surfaces 32M in the direction along axis 31J of shaft member 31 increases radially outward from axis 31J of shaft member 31. In other words, two inclined surfaces 32M are formed such that the distance between axis 31J and each of inclined surfaces 32M increases in the direction from core member 21 toward disk member 22. According to this configuration, effects similar to those of the above-described embodiment can be obtained.

Figure 8:
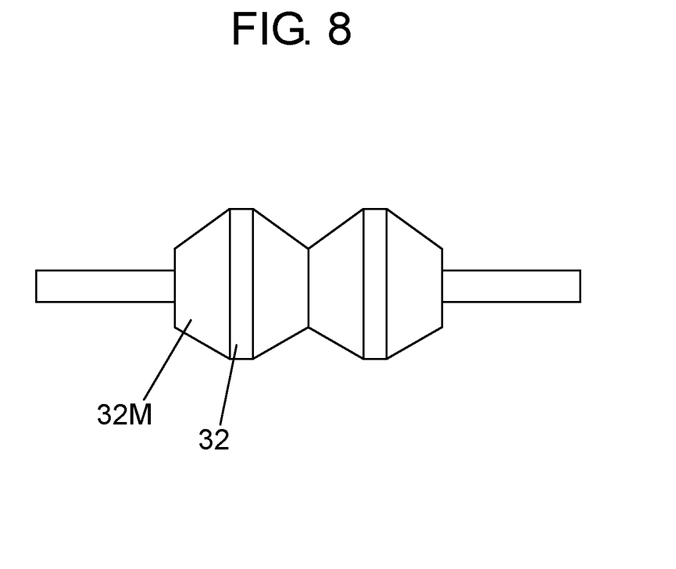
FIG. 8 is a schematic partial side view of a roller member in another modification example of the embodiment.

In the above-described embodiment, plurality (eight in the above-described example) of roller members 32 provided on same shaft member 31 are provided to be independent from each other. Plurality of adjacent roller members 32 (or all roller members 32 provided on same shaft member 31) may be integrally formed. In this case, the number of inclined surfaces 32M of roller member 32 is two or more, and if two tape reels 17 are supported by one roller member 32, the number of inclined surfaces 32M of roller member 32 is four. FIG. 8 shows a case where roller member 32 includes four inclined surfaces 32M.

As described above, the disclosure provides the tape reel supporting device, the component placement machine, and the tape reel supporting method capable of stably supporting the tape reel in the perpendicular state regardless of the reel width.

What is claimed is:

1. A tape reel supporting device supporting a tape reel configured to interpose a core member, around which a carrier tape having a stored component is wound, between a pair of disk members, in such a manner that a center axis of the core member is horizontal, the device comprising:
   a plurality of shaft members which extend to be parallel to each other in a horizontal direction; and
   a plurality of roller members provided to be externally fitted into each of the plurality of shaft members, each of the plurality of roller members having two inclined surfaces which are inclined to an axis of each of the shaft members, the two inclined surfaces abutting on outer peripheral edges of the pair of disk members,
   wherein the two inclined surfaces of each of the plurality of roller members are inclined in directions opposite to each other in a direction along the axis of each shaft member on which the roller members are provided, and
   wherein a distance between the axis and each inclined surface increases in a direction from the core member toward each disk member.

2. The tape reel supporting device of claim 1,
   wherein inclination angles of the two inclined surfaces of each roller member are substantially the same as each other with respect to the axis of the shaft member on which the roller member is provided.

3. A component placement machine, comprising:
a component supplier which pulls out the carrier tape from the tape reel supported by the tape reel supporting device of claim 1 and supplies the component to a pick-up position; and
a component mounter which picks-up the component supplied to the pick-up position by the component supplier and installs the component on a board.

4. A tape reel supporting method of supporting a tape reel configured to interpose a core member, around which a carrier tape having a stored component is wound, between a pair of disk members, in such a manner that a center axis of the core member is horizontal, using a tape reel supporting device including:
a plurality of shaft members which extend to be parallel to each other in a horizontal direction and
a plurality of roller members which are provided to be externally fitted into each of the plurality of shaft members,
the method comprising:
configuring each of the plurality of roller members such that two inclined surfaces inclined to an axis of the shaft member on which the roller member is provided are inclined in directions opposite to each other in a direction along the axis of the shaft member; and
allowing each of the two inclined surfaces provided on each of the plurality of roller members to abut on an outer peripheral edge of each of the pair of disk members,
wherein a distance between the axis and each inclined surface increases in a direction from the core member toward each disk member.

5. The tape reel supporting method of claim 4, wherein inclination angles of the two inclined surfaces of each roller member are substantially the same as each other with respect to the axis of the shaft member on which the roller member is provided.

6. A tape reel supporting device supporting a tape reel configured to interpose a core member, around which a carrier tape having a stored component is wound, between a pair of disk members, in such a manner that a center axis of the core member is horizontal, the device comprising:
one or more shaft members which extend to be parallel to each other in a horizontal direction; and
one or more roller members provided to be externally fitted into each of the one or more shaft members, each of the one or more roller members having two inclined surfaces which are inclined to an axis of each of the shaft members, the two inclined surfaces abutting on outer peripheral edges of the pair of disk members,
wherein the two inclined surfaces of each of the one or more roller members are inclined such that a distance between the axis and each inclined surface increases in a direction from the core member toward each disk member.

* * * * *